United States Patent [19]

Shibata et al.

[11] Patent Number: 5,306,602
[45] Date of Patent: Apr. 26, 1994

[54] METHOD OF PRODUCING LONGITUDINALLY FINE STRIPED TYPE HEAT SEAL CONNECTOR MEMBER

[75] Inventors: Mitsumasa Shibata, Kusatsu; Katsuhiro Murata; Tadaaki Isono, both of Ohtsu, all of Japan

[73] Assignee: Nippon Graphite Industries Ltd., Ohtsu, Japan

[21] Appl. No.: 20,902

[22] Filed: Feb. 22, 1993

Related U.S. Application Data

[63] Continuation of Ser. No. 918,802, Jul. 17, 1992, abandoned, which is a continuation of Ser. No. 616,403, Nov. 21, 1990, abandoned.

[30] Foreign Application Priority Data

Nov. 30, 1989 [JP] Japan .................................. 1-309173

[51] Int. Cl.$^5$ ........................... G03C 5/00; G03F 7/00
[52] U.S. Cl. .................................. 430/314; 430/311; 430/313; 430/318; 430/319
[58] Field of Search ................... 430/5, 220, 311, 313, 430/314, 318, 319, 322, 323, 324, 331

[56] References Cited

U.S. PATENT DOCUMENTS 4,696,764 9/1987 Yamazaki ........................ 524/439
4,751,146 6/1988 Maeda et al. ..................... 428/901

Primary Examiner—Marion E. McCamish
Assistant Examiner—Kathleen Duda
Attorney, Agent, or Firm—Ladas & Parry

[57] ABSTRACT

Longitudinally fine striped type heat seal connector member having a layer of an anisotropic press heat bonding agent which has satisfactory connection and reliable electrical conductivity in height or length direction as well as reliable electrical insulative property in lateral direction is provided by the method of the present invention, which is relatively simple in producing the layer of the anisotropic press heat bonding and which can dispense with some strong alkali or the like etching agent.

14 Claims, 1 Drawing Sheet

METHOD OF PRODUCING LONGITUDINALLY FINE STRIPED TYPE HEAT SEAL CONNECTOR MEMBER

This is a continuation of copending application(s) Ser. No. 07/918,802 filed on Jul. 17, 1992 now abandoned which is a continuation of application Ser. No. 06/616,403 filed Nov. 21, 1990 (now abandoned).

BACKGROUND OF THE INVENTION

1. Field of the Invention

The present invention relates to methods of producing longitudinally fine striped type heat seal connector members having a desired length, width and spacing of electrically conductive channels for mechanically and electrically connecting electrode portions of electronic elements, such as, liquid crystal display tubes, or electrochronic display (ECD) panels, solar cells, etc., to terminal portions of printed circuit substrates, or opposing terminal portions of printed circuit substrates to each other.

The present invention relates also to methods of producing longitudinally fine striped type heat seal connector members wherein an electrically conductive specific photoetching resistive pain (photoresist paint) is used to omit a portion of the photoetching process, while providing highly reliable connection property.

2. Related Art Statement

Heretofore, in case when producing the above longitudinally fine striped type heat seal connector members by using a conventional photoetching resistive ink, usually a film of a photosensitive etching-resistive material on a copper foil disposed on a substrate is exposed to a light through a negative mask to develop a desired pattern of electrically conductive circuit of the photocured photosensitive material. Then, the substrate having the photocured pattern thereon is subjected to an etching treatment to dissolve and remove excessive unnecessary unphoto-cured remaining etching resistive material around the photocured pattern of the photocured photosensitive material together with the underlying copper foil layer. Subsequently, the remaining photocured photosensitive etching resistive material on the copper foil of the electrically conductive circuit pattern is removed by a chemical agent, such as, an alkaline material, etc., to expose bare surfaces of the copper foil layer of the conductive circuit pattern. Thereafter, the substrate having the desired circuit pattern is treated in two different ways.

(a) One way is to form an electrically conductive layer of a press heat bonding agent containing conductive fine particles of a metal or graphite, etc., exclusively on the bare surfaces of the copper foil, i.e., solely on the circuit pattern, and then the substrate surface other than the circuit pattern is coated with an electrically insulative press heat bonding agent not containing electrically conductive fine particles in a separate process. Namely, the press heat bonding agent layers are prepared by two steps of preparing the layer of electrically conductive property and preparing the layer of electrically insulative property.

(b) The other way is to form a so-called "electrically anisotropic" heat seal layer on the whole one surface of the substrate, i.e., on the surface of the bare copper foil and on the remaining surface of the substrate around the bare copper foil not having the bare copper foil thereon. Namely, a layer of a press heat bonding agent is applied by coating on the whole one surface of the substrate, which layer of the bonding agent has different degrees of electrical conductivity between lateral direction (x direction) and height or length direction (y direction), the electrical conductivity thereof in height direction (y direction) keeping a certain range of electrically conductive property, and the electrical conductivity thereof in lateral direction (x direction) being very small and assuming relatively rather substantially electrically insulative property, when the composition per se of the press heat bonding layer is press heat bonded under a given condition.

However, these conventional methods have large drawbacks, though they have a few advantages. Namely, though the above method (a) has reliability and comparatively good performance in electrically conductive property, electrically insulative property and press heat bonding property, it necessitates a lengthy or time-consuming process requiring a double labor and materials for forming the press heat bonding layers. In addition, it necessitates a prolonged etching step for directly exposing the copper foil surface of the circuit pattern, complete washing of the circuit pattern to remove the used strong alkaline or the like chemical agent, and cumbersome problem of preventing environmental pollution caused by the used strong chemical agent.

Meanwhile, though the above method (b) is advantageous in that it needs not to provide two layers of press heat bonding agent and only one layer thereof is sufficient, and composition of the anisotropic heat seal layer and use condition thereof are strictly restricted. Moreover, properties of the formed press heat bonding layers fluctuates largely, so that sufficient reliability and stability in conductive property and insulative property are difficult to achieve. In addition, the above large drawbacks of the method (a) relating to the etching can not be avoided.

SUMMARY OF THE INVENTION

An object of the present invention is to obviate the above drawbacks of the conventional methods.

Another object of the present invention is to provide a method of producing longitudinally fine striped type heat seal connector member having a layer of press heat bonding agent which has reliable electrical conductivity in height or length direction as well as reliable electrical insulative property in lateral direction, which is relatively simple in producing the layer of the press heat bonding agent and which can dispense with some alkali or the like etching agent.

The inventors have made many studies and researches leading to the present invention wherein a photoetching resistive paint having a specific electrical conductivity is used and a relatively thin layer of a press heat bonding agent is formed on the photocured electrically conductive photoetching resistive layer left on the electrically conductive circuit pattern, as well as on the neighboring portions of the substrate films surrounding the circuit pattern.

The present invention is a method of producing longitudinally fine striped type heat seal connector members having a desired length, width and spacing of electrically conductive channels, comprising in combination a process A of mixing (a) 1-40 wt% of an electrically conductive fine powder of a grain of 1.0-50 μm and (b) 60-99 wt% of a photoetching resistive ink consisting mainly of acryl ester and a photosensitive acrylic polymer resin of a polymerization degree of 5,000-50,000 or a photosensitive epoxy polymer resin to prepare a uniformly dispersed electrically conductive photoetching resistive paint having an apparent specific gravity of 0.9-2.0 and a viscosity of 0.1-1000 poise, a process B of coating the photoetching resistive electrically conductive paint on a copper foil surface of a copper foil vapor deposited on a flexible insulative substrate film or a surface of a substrate film-foil composed of a flexible insulative film and a copper foil applied thereon to a thickness of 5-30 μm and drying the coated paint at 20°-70° C. for 10 min to 12 hrs, a process C of curing the coated paint obtained from the process B is exposed to an ultraviolet ray through a mounted negative mask having a longitudinally fine striped pattern of a desired size to cure or harden the irradiated patterned portions of the coated paint, a process D of rinsing and removing uncured portions of the electrically conductive photoetching resistive paint by using a weak alkaline aqueous solution and drying at 30°-120° C. to leave or form the applied and cured portions of the photoetching resistive paint of a desired pattern on the copper foil layer and to directly expose the copper foil layer, a process E of etching the directly exposed copper foil layer to remove the same, washing and removing the etchant thoroughly, and drying the substrate film-foil at 40°-100° C., a process F of applying by screen printing an electrically insulative press heat bonding suspension paint of an apparent specific gravity of 0.8-1.4 and a viscosity of 150-5000 poise on an entire surface of the substrate film-foil including the desired pattern portions of the photo-cured photoetching resistive layer coated on the copper foil surface and the remaining portions of the exposed and etched or copper-removed substrate film, and heat drying the applied suspension paint to form a press heat bonding layer at the uppermost layer of the substrate film-foil, a process G of severing the substrate film-foil having the press heat bonding layer as the uppermost layer and a desired electrically conductive circuit pattern thereunder obtained by the processes A+B+C+D+E+F to a desired size of length and width.

The heat seal connector member is used by contacting the press heat bonding layer at an end of the surface of the substrate film-foil obtained by the process G with an electrode portion of a liquid display tube, ECD panel, or solar cell, etc., or a terminal portion of a print circuited substrate, and contacting the press heat bonding layer at the other end of the surface of the substrate copper film-foil with the respective opposing terminal portion of a print circuited substrate, and press heat bonding the both ends of the surface of the substrate copper film-foil at a temperature of 100°-200° C. under a pressure of 10-70 kg/cm² to form respective integral heat bondings or heat sealings.

The electrically conductive fine powder (a) may consist of at least one powder selected from the group consisting of nickel plated and further gold plated copper powder, gold plated nickel powder, paradium powder, solder powder, and nickel plated and further gold plated resin beads powder.

The photoetching resistive ink may composed of (b) 15-25 wt% of a photosensitive acrylic polymer resin or epoxy polymer resin, (c) 1-10 wt% of acrylic ester, (d) 40-45 wt% of ethylcellosolveacetate, (e) 20-25 wt% of toluene, (f) 1-5 wt% of xylene, and (g) 1-5 wt% of methylethylketone.

The electrically insulative press heat bonding suspension paint may consist of (i) 5-30 wt% of at least one powder selected from the group consisting of titanium dioxide, talc, hydrated alumina and colloidal silica, (ii) 20-60 wt% of at least one thermoplastic resinous binder selected from the group consisting of chloroprene synthetic rubber, polyester resin, ethylene/vinyl acetate copolymer resin and polyethylmethacrylate resin, (iii) 10-70 wt% of at least one organic solvent selected from the group consisting of isophoron, diacetonealcohol, methylisobutylketone, xylene, toluene and diethylcarbitol, (iv) 0.1-20 wt% of at least one adhesion imparting agent (abbreviated as "adhesive", hereinafter) selected from terpene series resins and aliphatic hydrocarbon series resins, which (i+ii+iii+iv) are mixed, dissolved and uniformly dispersed.

The aforementioned nickel plated and further gold plated resin beads powder is produced by the following production steps.

Resin beads powder of phenol-formaldehyde series resin, styrene resin or styrene copolymer resin, such as, phenol resin powder sold from Unitika K.K. or styrene series resin powder sold from Kao K.K., having a grain size of 1-50 μm is treated at the surface by palladium chloride to impart a sensitivity to a nickel plating, and washed completely with water to obtain surface activated resin beads powder.

Then, the surface activated resin beads powder is immersed in an electroless nickel plating liquid held at 50°-65° C. containing 20 g/l of nickel sulfate, 10 g/l of sodium hyposulfite, 3 g/l of lactic acid, 5 g/l of sodium citrate, and 5 g/l of sodium sulfate, and electroless nickel plated for 5-60 min under agitation by a propeller, fluidization or air to make the plating film thickness uniform, to obtain a plating film thickness of 0.5-5 μm.

After the electroless nickel plating, the nickel plated beads powder is washed well with water to thoroughly remove the used nickel plating liquid from the nickel plated beads powder.

Thereafter, the nickel plated beads powder is put in an electroless gold plating liquid held at 90°-95° C. containing 2 g/l of gold potassium cyanate, 75 g/l of ammonium chloride, 50 g/l of sodium citrate, and 10 g/l of sodium hyposulfite, and electroless gold plated for 1-60 min under propeller agitation, fluidization agitation or air agitation to obtain a plated gold film of a uniform thickness of 0.1-3 μm.

After the electroless gold plating, the nickel plated and further gold plated beads powder is completely washed with water and hot water, completely removed of water, and dried at 50°-100° C. for 60 min -3 hrs under agitation.

In this way, the nickel plated and further gold plated resinous beads powder can be obtained.

The produced nickel and gold plated resin beads powder is given with electrical conductivity by the applied plating layers.

The heat seal connector members produced by the method of the present invention are widely used in electric or electronic devices, chronometers, cameras, word processors, etc.

The above acrylic ester (c) functions as a photo polymerization initiator, a solvent or a diluent, and usually, methylester, ethylester or propylester is preferably used.

The electrically conductive photoetching resistive ink may be a commercial one, such as, PMER-N-HC40

(trade name) produced and sold from Tokyo Ohka Kogyo K.K.

In the process A, a wet type ball mill may be used for the mixing and uniform dispersion.

The flexible electrically insulative film may be polyester, polyimide, polyimideamide, nylon or aramide resin film, etc., for example, but is not restricted thereto.

Hereinafter, reasons for the numerical limitations will be briefly explained.

The electrically conductive fine powders (a) of a grain size of less than 1.0 μm are generally difficult to obtain in the market. While, the electrically conductive fine powders (a) of a grain size of exceeding 50 μm are hard to provide a uniform coating and the electrical conductivity of the paint coating is untolerably fluctuated. If the amount of the electrically conductive fine powder (a) is less than 1 wt%, the electrical conductivity of the coating becomes insufficient, while if it exceeds 40 wt%, the paint coating is adversely influenced in initiating the photocuring by exposure to light.

If the amount of the photosensitive polymer resin (b) is less than 15 wt%, the photosensitive function of the paint becomes too weak, while if it exceeds 25 wt%, practical effect of using it is not increased much and the excessive use thereof is unnecessary from economical viewpoint.

If the amount of the photoinitiator acrylesteris (c) is less than 1 wt%, the effect of the photoinitiator in the paint becomes weak and the solubility and the dispersive property of the photosensitive polymer resin becomes bad, while if it exceeds 10 wt%, the effect of the photoinitiator reaches to a substantially saturated state so that the necessity thereof is decreased.

If the amount of ethyllcelosolveacetate (d) exceeds 45 wt%, dissolving function and diluting function thereof are increased and the concentration of the resin is relatively decreased, while if it is less than 40 wt%, the concentration of the resin in the ink is relatively increased, while if it is than 40 wt%, the concentration of the resin in the ink is relatively increased, so that the apparent specific gravity and the viscosity are increased resulting in bad printing property.

If the amount of toluene (e) exceeds 25 wt%, the dilution degree of the resin in the ink is increased to decrease the concentration of the resin, while if it is less than 20 wt%, the dilution degree is decreased to relatively increase the concentration of the resin to result in bad printing property of the paint. Therefore, the above range of toluene is preferable from the viewpoint of printability of the paint If the amount of xylene (f) exceeds 5 wt%, the dilution degree of the resin in the ink is increased to decrease the concentration of the resin, while if it is less than 1 wt%, the dilution degree is decreased to relatively increase the concentration of the resin to result in bad printing property of the ink. Therefore, the above range of xylene is preparable from the viewpoint of printability of the paint.

If the amount of methylethylketone (g) exceeds 5 wt%, the dilution degree is increased to decrease the concentration of the resin in the ink, while if it is less than 1 wt%, the dilution degree is decreased to relatively increase the concentration of the resin in the ink to result in bad printing property of the ink. Therefore, the above range of methylethylketone is preferable from the viewpoint of printability of the paint.

If the amount of the photoetching resistive ink (b+c+d+e+f+g) exceeds 99 wt% in the paint, the amount of the electrically conductive fine powder is correspondingly decreased to less than 1 wt% to result in insufficient electrical conductivity. While, if it is less than 60 wt%, the amount of the electrically conductive fine powder is correspondingly increased to more than 40 wt% to affect an adverse influence over photocuring by exposure to light.

BRIEF DESCRIPTION OF THE DRAWINGS

For a better understanding of the present invention, reference is made to the accompanying drawings, in which.

Figure 1:
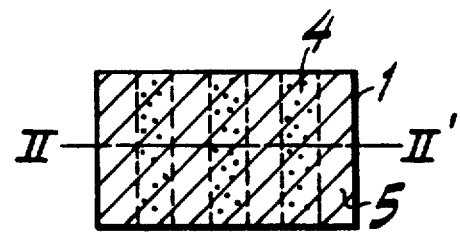
FIG. 1 is a schematic enlarged front cross-sectional view of an embodiment of the heat seal connector member according to the present invention.
Figure 2:
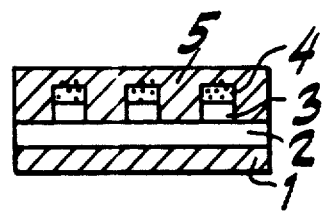
FIG. 2 is a schematic enlarged cross-sectional view thereof taken along the line II—II'.
Figure 3:
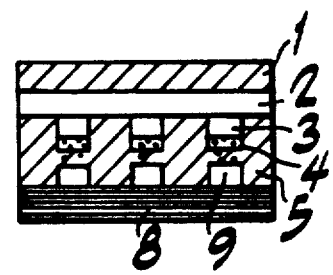
FIG. 3 is a schematic enlarged cross sectional view of the main portion of the heat seal connector member according to the present invention after press heat bonded.
Figure 4:
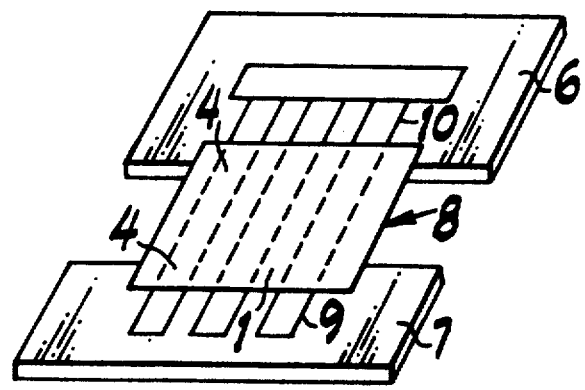
FIG. 4 is a schematic perspective view showing an example of a used state of the heat seal connector member according to the present invention after press heat bonded.

Numberings in the drawings.
1 ... flexible electrically insulating film
2 ... adhesive layer
3 ... circuit copper
4 ... circuit copper coated with the electrically conductive photoetching resistive layer
5 ... electrically insulative press heat bonding layer
6 ... various display
7 ... substrate of a printed circuit
8 ... heat seal connector member according to an example of the present invention
9 ... electrode portion of a liquid crystal display tube
10 ... terminal portion of a substrate of a printed circuit Hereinafter, the present invention will be explained in more detail with reference to Examples.

Example 1

Process A 20 wt% of (b) photosensitive acryl polymer for photoresist, 5 wt% of (c) acrylethylester, 45 wt% of (d) ethylcellosolveacetate, 20 wt% of (e) toluene, 5 wt% of xylene, and 5 wt% of methylethylketone are reciped and blended to prepare a mother ink liquid, namely, a photoresistive ink.

80 wt% of the photoresistive ink is added and mixed with 20 wt% of (a) gold-plated nickel powder of particle diameters of 20–40 μm to prepare a uniformly dispersed electrically conductive photoetching resistive paint having an apparent specific gravity of 1.0 and a viscosity of 30 centi poise.

Process B

The electrically conductive photoetching resistive paint is applied to a thickness of 20 μm by coating on a copper foil surface of a copper foil-film composed of a polyethylene film of a thickness of 25 μm and a rolled copper foil of a thickness of 15 μm applied thereon, and dried at 70° C. for 2 hrs.

Process C

A negative film having a depicted desired negative pattern is mounted on the dried paint coated surface of the copper foil-film, intimately adhered thereto in vacuo, and irradiated by an ultraviolet ray at an intensity of 45 mJ/cm² to photocure the irradiated unmasked coated surface.

Process D

The photocured copper foil-film after the exposure to the ultraviolet ray is immersed in a weak alkaline aqueous solution for a developing treatment to remove unphotocured portions (other than the desired pattern portions) of the coated surface of the copper foil-film to directly expose copper foil portions, rinsed well with water to remove the developer solution, removed of water by blowing air from an air gun, and dried at 60° C. for 60 min.

Process E

The directly exposed copper foil portions of the copper foil-film are all removed by an etching treatment, then washed well with water to remove the etching solution, and dried in warm air wind at 100° C. for 2 min.

Process F

The copper foil-film having thereon the desired pattern of the photocured photoetching resistive layer and the exposed remaining polyester film around the desired pattern, is coated on the surface with an electrically insulative press heat bonding type suspension paint layer, and heat dried to form a press heat bonding layer. The suspension paint consists of 10 wt% of titanium oxide, 45 wt% of synthetic chloroprene rubber, 25 wt% of xylene, 10 wt% of methylisobutylketone, 7.5 wt% of isophorone and 2.5 wt% of terpene series resin, and has an apparent specific gravity of 1.0 and a viscosity of 500 poise.

Process G

Thus formed substrate film having the press heat bonding type suspension paint layer is severed to chips of a desired size of length and width to form a longitudinally fine striped type heat seal connector member.

Process H

The press heat bonding layer on one end of the surface of the obtained substrate chip is contacted with an electrode of a liquid crystal display tube, and the press heat bonding layer on the other end of the surface of the obtained substrate chip is contacted with a terminal portion of a printed circuit substrate. Then, the press heat bonding layers on the both ends of the surface of the substrate chip are press heat bonded respectively integrally at a temperature of 180° C. under a pressure of 30 kg/cm².

In practical use, the heat seal connector member exhibited satisfactory electrical and mechanical results, showing the distinguished effects of the present invention.

In this case, for evaluating the electrical property, initial electric resistance value of the connector member was measured, and electric resistance value (aged value) of the connector member after left at 60° C. in air of a relative humidity of 95% for 1000 hrs was measured. All aged resistance values were less than 110%, when taken the initial resistance value as 100%.

For evaluating the electrical property, thermal shock test was also effected at 100 cycles of repetitions of a cycle of −40° C. for 30 min; water ambient temperature for 5 min; and 85° C. for 30 min. All thermal shocked connector members were less than 120%, when taken the initial thermal shock value as 100%.

For evaluating the mechanical property, initial adhesive power per a length of 1 cm of the connector member was measured, and aged adhesive power of the connector member after left at 60° C. in air of a relative humidity of 95% for 1000 hrs was measured. All aged adhesion values were within a range of 70–100%, when taken the initial value as 100%.

In this case, substantially the same results were obtained, when a photosensitive epoxy series polymer resin was used instead of the abovementioned photosensitive acrylic polymer resin.

Example 2

90 wt% of a commercial negative type photoresistive ink produced by Tokyo Ohka Kogyo K.K. and sold under the trade name of PMER-N-HC40 and composed mainly of acrylic polymer is added and mixed with 10 wt% of a copper powder of a grain size of 40–50 μm having a nickel plating and further a gold plating thereon to uniformly disperse the plated copper powder in the ink so as to prepare a photoetching resistive electrically conductive paint of an apparent specific gravity of 1.0 and a viscosity of 20 centi poise.

Then, the processes of Example 1 are repeated substantially in the same manner as in Example 1 to obtain a longitudinally fine striped type heat seal connector member.

In practical use, the connector member exhibited substantially the same results in electrical and mechanical connections with those of Example 1, showing the distinguished effects of the present invention.

Example 3

Process A (a) 4 wt% of a nickel plated and further gold plated resin beads powder of a grain size of 40–50 μm is added and mixed with 96 wt% of a photoresistive ink (composed mainly of acrylic polymer), i.e., mother ink liquid prepared by reciping and blending (b) 25 wt% of photocurable type acrylic polymer suited for the preparation of the photoresistive ink, (c) 10 wt% of photopolymerization initiator acrylic ester, (d) 40 wt% of ethylcellosolveacetate, (e) 20 wt% of toluene, (f) 3 wt% of xylene, and (g) 2 wt% of methylethylketone, and dispersed uniformly to obtain an electrically conductive photoetching resistive paint having an apparent specific gravity of 0.9 and a viscosity of 15 centi poise.

Process B

Then, the photoetching resistive paint is applied by coating to a thickness of 15 μm on a copper foil surface of a copper foil-film composed of a polyethylene film of a thickness of 25 μm and a rolled copper foil of a thickness of 15 μm applied thereon, and dried at 60° C. for 10 hrs.

Process C

A negative film depicting desired negative pattern is mounted on the dried paint coated surface, intimately adhered thereto in vacuo, and exposed to an ultra violet ray of 100 mJ/cm² to photocure the exposed pattern portions of the coating paint surface.

Process D

Nonphotocured portions (portions other than the exposed patterned portions) of the electrically conductive coating paint surface on the copper foil-film are removed by a development treatment by means of a weak alkaline aqueous solution to directly expose portions of the copper foil. Then, the copper foil-film is washed well with water to remove the development solution, removed of water by blowing air from an air gun, and dried at 70° C. for 30 min.

Process E

The directly exposed copper foil portions of the copper foil-film are all removed by etching, then washed well with water to remove the etchant, and dried in warm wind at 40° C. for 15 min.

Process F

The copper foil-film having thereon the desired pattern of the photocured photoetching resistive layer and the exposed remaining polyester film around the desired pattern, is coated on the surface with an electrically insulative press heat bonding type suspension paint layer, and dried under heating to form a press heat bonding layer. The paint consists of 20 wt% of hydrated alumina, 40 wt% of ethylene/vinyl acetate copolymer resin, 10 wt% of toluene, 5 wt% of methylisobutylketone, 10 wt% of isophorone, and 15 wt% of terpene series resin, and has an apparent specific gravity of 1.3 and a viscosity of 1,000 poise.

Process G

Thus formed substrate film having the press heat bonding layer is severed to chips of a desired size of length and width, as shown in the drawings, to form a longitudinally fine striped type heat seal connector member.

Process H

The press heat bonding layer on one end of the surface of the obtained substrate chip is contacted with an electrode of a liquid crystal display tube, and the press heat bonding layer on the other end of the surface of the obtained substrate chip is contacted with a terminal portion of a printed circuit substrate. Then, the press heat bonding layers on the both ends of the surface of the substrate chip are press heat bonded respectively integrally at temperature of 180° C. under a pressure of 30 kg/cm$^2$.

In practical use, the heat seal connector member exhibited substantially the same satisfactory results in electrical and mechanical connection as those of Example 1, showing the distinguished effects of the present invention.

In this case, too, substantially the same results were obtained, when a photosensitive epoxy series polymer resin was used instead of the above-mentioned photosensitive acrylic polymer resin.

Example 4

Process A (a) 45 wt% of a gold-plated nickel powder of particle diameters of 40–50 μm is added and mixed with 55 wt% of a photoresistive ink (composed mainly of acrylic polymer) prepared by reciping and blending (b) 15 wt% of a photocurable type photosensitive acrylic polymer resin suited for the preparation of the photoresistive ink (c) 2 wt% of photopolymerization initiator acrylester, (d) 45 wt% of ethylcellosolveacetate, (e) 25wt% of toluene, (f) 7 wt% of xylene, and (g) 6 wt% of methylethylketone, and dispersed uniformly to obtain an electrically conductive photoetching resistive paint having an apparent specific gravity of 1.8 and a viscosity of 600 poise.

Process B

Then, the photoetching resistive paint is applied by coating to a thickness of 30 μm on a copper foil surface of a copper foil-film composed of a polyester film of a thickness of 25 μm and a copper foil of a thickness of 15 μm applied thereon, and dried at 70° C. for 2 hrs.

Process C

A negative film depicting a desired negative pattern is mounted on the dried paint coated surface, intimately adhered thereto in vacuo, and exposed to an ultra violet ray of 200 mJ/cm$^2$ to photocure the exposed pattern portions of the coating paint surface.

Process D

Non-photocured portions (portions other than the exposed patterned portions) of the electrically conductive coating paint surface on the copper foil-film are removed by a development treatment using a weak alkaline aqueous solution to directly expose portions of the copper foil. Then, the copper foil-film is washed well with water to remove the development solution, removed of water on the copper foil by blowing air from an air gun, and dried at 40° C. for 3 hrs.

Process E

The directly exposed copper foil portions of the copper foil-film are all removed by etching, then washed well with water to remove the etchant, and dried in warm wind at 50° C. for 10 min.

Process F

The copper foil-film having thereon the desired pattern of the photocured photoetching resistive layer and the exposed remaining polyester film around the desired pattern, is coated on the surface with an electrically insulative press heat bonding type suspension paint layer, and dried under heating to form a press heat bonding layer. The paint consists of 5 wt% of talc, 60 wt% of polyethylmethacrylate resin, 10 wt% of diacetonealcohol, 10 wt% of toluene, and 15 wt% of methylisobutylketone, and has an apparent specific gravity of 1.4 and a viscosity of 500 poise.

Process G

Then, the thus formed substrate film having the press heat bonding layer is severed to chips of a desired size of length and width to form a longitudinally fine striped type heat seal connector member

Process H

The press heat bonding layer on one end of the surface of the obtained substrate chip is contacted with an electrode of a liquid crystal display tube, and the press heat bonding layer on the other end of the surface of the obtained substrate chip is contacted with a terminal portion of a printed circuit substrate. Then, the press heat bonding layers on the both ends of the surface of the substrate chip are press heat bonded respectively integrally at a temperature of 150° C. under a pressure of 40 kg/cm$^2$.

In practical use, the heat seal connector member exhibited substantially the same satisfactory results in electrical and mechanical connection as those of Example 1, showing the distinguished effects of the present invention.

In this case, too, substantially the same results were obtained, when a photosensitive epoxy series polymer resin wa used instead of the abovementioned photosensitive acrylic polymer resin.

Example 5

Process A (a) 20 wt% of a gold plated nickel powder of particle diameters of 20–40 μm is added and mixed with 80 wt% of a photoresistive ink or mother ink prepared by reciping and blending (b) 20 wt% of (a) photosensitive acrylic polymer resin suited for the preparation of the photoresistive ink, (c) 5 wt% of (a) acrylethylester, (d) 45 wt% of ethylcellosolveacetate, (e) 20 wt% of toluene, (f) 5 wt% of xylene, and (g) 5 wt% of methylethylketone, and dispersed uniformly to obtain an electrically conductive photoetching resistive paint having an apparent specific gravity of 1.0 and a viscosity of 30 centi poise.

Process B

Then, the photoetching resistive paint is applied by coating to a thickness of 20 μm on a copper foil surface of a copper foil-film composed of a polyester film of a thickness of 25 μm and a copper foil of a thickness of 15 μm applied thereon, and dried at 70° C. for 2 hrs.

Process C

A negative film depicting a desired negative pattern is mounted on the dried paint coated surface, intimately adhered thereto in vacuo, and exposed to an ultra violet ray of 45 mJ/cm$^2$ to photocure the exposed pattern portions of the coating paint surface.

Process D

Non-photocured portions (portions other than the exposed patterned portions) of the electrically conductive coating paint surface of the copper foil-film are removed by a development treatment using a weak alkaline aqueous solution to directly expose portions of the copper foil. Then, the copper foil-film is washed well with water to remove the development solution, removed of water on the copper foil by blowing air from an air gun, and dried at 60° C. for 60 min.

Process E

The directly exposed copper foil portions of the copper foil-film are all removed by etching, then washed well with water to remove the etchant, and dried in warm wind at 100° C. for 2 min.

Process F

The copper foil-film having thereon the desired pattern of the photocured photoetching resistive layer and the exposed remaining polyester film portions around the desired pattern, is coated on the surface with an electrically insulative press heat bonding type suspension paint layer, and dried under heating to form a press heat bonding layer. The paint consists of 10 wt% of titanium oxide, 45 wt% of chloroprene synthetic rubber, 25 wt% of xylene, 7.5 wt% of isophorone, 10 wt% of methylisobutylketone, and 2.5 wt% of terpene series resin, and has an apparent specific gravity of 0.95 and a viscosity of 300 poise.

Process G

Then, the thus formed substrate film having the press heat bonding layer is severed to chips of a desired size of length and width to form a longitudinally fine striped type heat seal connector member.

Process H

The press heat bonding layer on one end of the surface of the obtained substrate chip is contacted with an electrode of a liquid crystal display tube, and the press heat bonding layer on the other end of the surface of the obtained substrate chip is contacted with a terminal portion of a printed circuit substrate. Then, the press heat bonding layers on the both ends of the surface of the substrate chip are press heat bonded respectively integrally at a temperature of 180° C. under a pressure of 30 kg/cm$^2$.

In practical use, the heat seal connector member exhibited satisfactory electrical results, showing the distinguished effects of the present invention.

Example 6

90 wt% of a commercial negative type photoresistive ink consisting mainly of acrylic polymer (trade name "PMER-N-HC40, produced by Tokyo Ohka Kogyo K.K.) is added and mixed with 10 wt% of a nickel plated and gold plated copper powder of a grain size of 40–50 μm, and uniformly dispersed to prepare an electrically conductive photoetching resistive paint having an apparent specific gravity of 1.0 and a viscosity of 20 centipoise.

Then, the processes of Example 1 are repeated in substantially the same manner as in Example 1 to obtain a longitudinally fine striped type heat seal connector member.

In practical use, the heat seal connector member exhibited substantially the same satisfactory results in electrical and mechanical connection as those of Example 1, showing the distinguished effects of the present invention.

Example 7

Process A (a) 15 wt% of a nickel plated and further gold plated resin beads powder of a grain size of 10–40 μm is added and mixed with 85 wt% of a photoresistive ink, i.e., mother ink liquid prepared by reciping and blending (b) 20 wt% of photosensitive acrylic polymer suited for the preparation of the photoresistive ink (c) 5 wt% of acrylethylester, (d) 45 wt% of ethylcellosolveacetate, (e) 25 wt% of toluene, (f) 5 wt% of xylene, and (g) 5 wt% of methylethylketone, and dispersed uniformly to obtain an electrically conductive photoetching resistive paint having an apparent specific gravity of 0.9 and a viscosity of 15 centi poise.

Process B

Then, the photoetching resistive paint is applied by coating to a thickness of 25 μm on a copper foil surface of a copper foil-film composed of a polyethylene film of a thickness of 38 μm and an electrolysis copper foil of a thickness of 35 μm applied thereon, and dried at 70° C. for 2 hrs.

Process C

A negative film depicting a desired negative pattern is mounted on the dried paint coated surface, intimately adhered thereto in vacuo, and exposed to an ultra violet ray of 50 mJ/cm$^2$ to photocure the exposed pattern portions of the coating paint surface.

Process D

Non-photocured portions (portions other than the exposed patterned portions) of the electrically conductive coating paint surface on the copper foil-film are removed by a development treatment by means of a weak alkaline aqueous solution to directly expose portions of the copper foil. Then, the copper foil-film is washed well with water to remove the development solution, removed of water by blowing air from an air gun, and dried at 60° C. for 60 min.

Process E

The directly exposed copper foil portions of the copper foil-film are all removed by etching, then washed well with water to remove the etchant, and dried in warm wind at 100° C. for 2 min.

Process F

The copper foil-film having thereon the desired pattern of the photocured photoetching resistive layer and the exposed remaining polyester film around the desired pattern, is coated on the surface with an electrically insulative press heat bonding type suspension paint layer at portions to be press heat bonded, and dried under heating to form a press heat bonding layer. The paint consists of 10 wt% of titanium oxide, 45 wt% of chloroprene synthetic rubber, 25 wt% of xylene, 10 wt% of methylisobutylketone, 7.5 wt% of isophorone, and 2.5 wt% of terpene series resin, and has an apparent specific gravity of 0.98 and a viscosity of 350 poise.

Process G

The pattern portions other than the press heat bonding layer of the polyester film not having the press heat bonding layer of the above pattern, and the portions surrounding the pattern portions, are applied with a polyester film of one side adhesive type of a thickness of 25 $\mu$m for assuring electrically insulative property.

Process H

Thus formed substrate film having the press heat bonding layer is severed to chips of a desired size of length and width to form a longitudinally fine striped type heat seal connector member.

Process I

The press heat bonding layer on one end of the surface of the obtained substrate chip is contacted, for example, with an electrode of a liquid crystal display tube, and the press heat bonding layer on the other end of the surface of the obtained substrate chip is contacted with a terminal portion of a printed circuit substrate. Then, the press heat bonding layers on the both ends of the surface of the substrate chip are press heat bonded respectively integrally at a temperature of 180° C. under a pressure of 30 kg/cm$^2$.

In practical use, the heat seal connector member exhibited substantially the same satisfactory results in electrical and mechanical connection as those of Example 1, showing the distinguished effects of the present invention.

Example 8

Process A (a) 15 wt% of a gold plated nickel powder of a grain size of 20–30 $\mu$m is add and mixed with 85 wt% of a photoresistive ink or mother ink liquid prepared by reciping and blending (b) 20 wt% of a photosensitive acrylic polymer suited for the preparation of the photoresistive ink, (c) 5 wt% of acrylethylester, (d) 45 wt% of ethylcellosolveacetate, (e) 25 wt% of toluene, (f) 5 wt% of xylene, and (g) 5 wt% of methylethylketone, and dispersed uniformly to obtain an electrically conductive photoetching resistive paint having an apparent specific gravity of 1.0 and a viscosity of 15 centi poise.

Process B

Then, the photoetching resistive paint is applied by coating to a thickness of 20 $\mu$m on a copper foil surface of a copper foil-film composed of a polyester film of a thickness of 50 $\mu$m and a rolled copper foil of a thickness of 18 $\mu$m applied thereon, and dried at 70° C. for 1 hr.

Process C

A negative film depicting a desired negative pattern is mounted on the dried paint coated surface, intimately adhered thereto in vacuo, and exposed to an ultra violet ray of 40 mJ/cm$^2$ to photocure the exposed pattern portions of the coating paint surface.

Process D

Non-photocured portions (portions other than the exposed patterned portions) of the electrically conductive paint coated surface on the copper foil-film is removed by a development treatment by means of a weak alkaline aqueous solution to directly expose portions of the copper foil. Then, the copper foil-film is washed well with water to remove the development solution, removed of water by blowing air from an air gun, and dried at 40° C. for 60 min.

Process E

The directly exposed copper foil portions of the copper foil-film are all removed by etching, then washed well with water to remove the etchant, and dried in warm wind at 100° C. for 2 min.

Process F

The copper foil-film having thereon the desired pattern of the photocured photoetching resistive layer and the exposed remaining polyester film around the desired pattern, is coated on the surface with an electrically insulative press heat bonding type suspension paint at one end to be press heat bonded and dried under heating to form a press heat bonding layer The paint consists of 10 wt% of titanium oxide, 45 wt% of chloroprene synthetic rubber, 25 wt% of xylene, 10 wt% of methylisobutylketone, 7.5 wt% of isophorone, and 2.5 wt% of terpene series resin, and has an apparent specific gravity of 1.00 and a viscosity of 400 poise.

Process G

After finishing the process F of forming the press heat bonding layer, the copper foil-film having the electrically conductive photoetching resistive paint on the surface is peeled and removed from the copper foil with the aid of ethyl alcohol so as to make the other end of the copper foil-film as an insertion type connector.

Process H

Thus formed substrate film having the press heat bonding layer is severed to chips of a desired size of length and width to form a longitudinally fine striped type heat seal connector member.

Process I

The press heat bonding layer on one end of the surface of the obtained substrate chip is contacted, for example, with an electrode of ECD, and the insertion type connector portion on the other end of the surface of the obtained substrate chip is inserted in an insertion type connector portion of a printed circuit substrate, and the press heat bonding layer on the end of the surface of the substrate chip is press heat bonded at a temperature of 150° C. under a pressure of 35 kg/cm², to make then respectively integrally.

In practical use, the heat seal connector member exhibited substantially the same satisfactory results in electrical and mechanical connection as those of Example 1, showing the distinguished effects of the present invention.

Example 9

Process A (a) 15 wt% of a solder powder of particle diameters of 30–50 μm is added and mixed with 85 wt% of a photoresistive ink (trade name "PMER-N-HC40" produced by Tokyo Ohka Kogyo K.K., composed mainly of acrylic polymer), and dispersed uniformly to obtain an electrically conductive photoetching resistive paint having an apparent specific gravity of 0.9 and a viscosity of 40 centi poise.

Process B

Then, the photoetching resistive paint is applied by coating to a thickness of 30 μm on a copper foil surface of a copper foil-film composed of an aramid film of a thickness of 16 μm and an electrolysis copper foil of a thickness of 18 μm applied thereon, and dried at 50° C. for 2 hrs.

Process C

A negative film depicting a desired negative pattern is mounted on the dried paint coated surface, intimately adhered thereto in vacuo, and exposed to an ultraviolet ray of 55 mJ/cm² to photocure the exposed pattern portions of the coating paint on the surface.

Process D

Non-photocured portions (portions other than the exposed patterned portions) of the electrically conductive paint coated surface on the copper foil-film is removed by a development treatment by means of a weak alkaline aqueous solution to directly expose portions of the copper foil. Then, the copper foil-film is washed well with water to remove the development solution, removed of water by blowing air from an air gun, and dried at 60° C. for 50 min.

Process E

The directly exposed copper foil portions of the copper foil-film are all removed by etching, then washed well with water to remove the etchant, and dried in warm wind at 100° C. for 2 min.

Process F

The copper foil-film having thereon a desired pattern of the photocured photoetching resistive layer and the exposed remaining polyester film around the desired pattern, is coated on the surface with an electrically insulative press heat bonding type suspension paint at one end to be press heat bonded, and dried under heating to form a press heat bonding layer. The paint consists of 10 wt% of titanium oxide, 45 wt% of chloroprene synthetic rubber, 25 wt% of xylene, 10 wt% of methylisobutylketone, 7.5 wt% of isophorone, and 2.5 wt% of terpene series resin, and has an apparent specific gravity of 0.96 and a viscosity of 200 poise.

Process G

After finishing the process F of forming the press heat bonding layer, the copper foil-film having the electrically conductive photoetching resistive pattern paint on the surface is peeled and removed from the copper foil with the aid of ethyl alcohol so as to make the other end of the copper foil-film ready for soldering.

Process H

Thus formed substrate film having the press heat bonding layer is severed to chips of a desired size of length and width to form a longitudinally fine striped type heat seal connector member.

Process I

The press heat bonding layer on one end of the surface of the obtained substrate chip is contacted, for example, with an electrode of a liquid crystal display tube and press heat bonded at a heating temperature of 170° C. under a pressure of 30 kg/cm², and the other end of the surface of the obtained substrate chip is contacted with a terminal portion of a printed circuit substrate and soldered thereto, to make them respectively integrally.

In practical use, the heat seal connector member exhibited substantially the same satisfactory results in electrical and mechanical connection as those of Example 1, showing the distinguished effects of the present invention.

As described in detail in the foregoings, according to the present invention, the process of photoetching is partially shortened or dispensed with and environment-polluting chemicals such as caustic materials can be omitted by utilizing the specific electrically conductive photoetching resistive paint, and a method of producing highly reliable longitudinally fine striped heat seal connector members for ready electrical connection in vertical direction can be provided by leaving the applied photocured electrically conductive resistive paint layer on the electrically conductive pattern of the copper foil, providing a thin press heat bonding layer on the photocured electrically conductive resistive paint layer as well as on the flexible substrate film.

Although the present invention has been described with reference to specific examples and numerical values, it should be understood that the present invention is not restricted to such examples and numerical values, and numerous changes and modifications are possible without departing from the broad spirit and the aspect of the present invention as defined in the appended claims.

What is claimed is:

1. A method of producing longitudinally fine striped type heat seal connector members having a desired length, width and spacing of electrically conductive channels, said method comprising the following process steps:
   (A) mixing an electrically conductive fine powder with a photoresist ink to produce a uniformly dispersed electrically conductive photoresist paint;
   (B) applying a coating of said electrically conductive photoresist paint on the surface of a copper foil on a flexible insulative substrate film;
   (C) curing the paint on the copper foil by exposing the paint to ultraviolet radiation through a negative mask having a pattern on longitudinally fine stripes to cure irradiated patterned portions of the coated paint;
   (D) removing uncured portions of the electrically conductive photoresist paint to leave the cured portions of the photoresist paint of the desired pattern on the copper foil layer and to directly expose the copper foil layer in the portions where the uncured portions of the paint have been removed;
   (E) etching the exposed portions of the copper foil layer to remove the same down to the substrate film on which the copper film layer is applied whereby to obtain the substrate film with the pattern of copper foil thereon covered by the photo-cured paint;
   (F) applying an electrically insulative press heat bonding suspension paint over the entire surface of the substrate including the pattern of the photo-cured paint on the copper foil and the bare portions of the substrate from which the copper foil layer has been removed to form a press heat bonding layer as an uppermost covering layer; and
   (G) cutting the resulting produce to a desired length and width.

2. A method as claimed in claim 1, wherein the photoresist ink is formed by mixing a photosensitive acrylic or epoxy resin with an acrylic ester.

3. A method as claimed in claim 1, wherein said photoresist ink is formed by mixing together a composition consisting essentially of:

| | | |
|---|---|---|
| 15-25 | wt % | photosensitive acrylic or epoxy polymer |
| 1-10 | wt % | acrylic ester |
| 40-45 | wt % | ethylcellosolveacetate |
| 20-25 | wt % | toluene |
| 1-5 | wt % | xylene |
| 1-5 | wt % | methylethylketone |

4. A method as claimed in claim 1, wherein said electrically conductive fine powder is present in an amount of 1-40 wt% of said electrically conductive photoresist paint.

5. A method as claimed in claim 4, wherein said electrically conductive fine powder has a grain size of 1.0 to 50 μm.

6. A method as claimed in claim 5, comprising forming said electrically conductive photoresist paint with a specific gravity of 0.9-2.0 and a viscosity of 0.1-1000 poise.

7. A method as claimed in claim 1, wherein said electrically conductive fine powder is selected from the group consisting of nickel plated and gold plated copper powder, gold pated nickel powder, palladium powder, solder powder, and nickel plated and gold plated resin beads.

8. A method as claimed in claim 1, wherein said electrically conductive photoresist paint is applied to said copper foil with a thickness of 5 to 30 μm.

9. A method as claimed in claim 8, comprising drying said paint, after applying same on said copper foil, at a temperature of 20°-70° C. for 10 minutes to 12 hours.

10. A method as claimed in claim 1, wherein said uncured portions of said electrically conductive photoresist paint are removed from said copper foil by applying a weal alkaline aqueous solution on said paint.

11. A method as claimed in claim 1, wherein said electrically insulative press heat bonding suspension paint is formed y mixing together a composition which consists essentially of:
   5-30 wt% of at least one powder selected from the group consisting of titanium dioxide, talc, hydrated alumina and colloidal silica,
   20-60 wt% of at least one thermoplastic resinous binder selected from the group consisting of chloroprene, synthetic rubber, polyester resin, ethylene/vinyl acetate copolymer resin and polyethylmethacrylate resin,
   10-70 wt% of at least one organic solvent selected from the group consisting of isophorone, diacetonealcohol, methylisobutylketone, xylene, toluene and diethylcarbitol, and
   0.1-20 wt% of at least one adhesion imparting agent or adhesive selected from the group consisting of terpene resins and aliphatic hydrocarbon resins.

12. A method as claimed in claim 1, comprising forming said press electrically insulative heat bonding suspension paint with a specific gravity of 0.8 to 1.4 and a viscosity of 150 to 5000 poise.

13. A method as claimed in claim 1, wherein said photoresist ink comprises a photosensitive polymer, and a photopolymerization initiator in solvent or diluent.

14. A method as claimed in claim 13, wherein said photosensitive polymer consists of an acrylic or epoxy resin, and said photopolymerization initiator consists of an acrylic ester.

* * * * *